(12) United States Patent
Reuter

(10) Patent No.: US 10,566,956 B2
(45) Date of Patent: Feb. 18, 2020

(54) CASCADED TRANSCEIVER INTEGRATED CIRCUIT

(71) Applicant: NXP B.V.

(72) Inventor: Ralf Reuter, Landshut (DE)

(73) Assignee: NXP B.V., Eindhoven (NL)

( * ) Notice: Subject to any disclaimer, the term of this patent is extended or adjusted under 35 U.S.C. 154(b) by 115 days.

(21) Appl. No.: 15/843,102

(22) Filed: Dec. 15, 2017

(65) Prior Publication Data

US 2018/0175831 A1  Jun. 21, 2018

(30) Foreign Application Priority Data

Dec. 21, 2016  (EP) .................... 16205828

(51) Int. Cl.
| | |
|---|---|
| *H03K 3/01* | (2006.01) |
| *H01Q 9/04* | (2006.01) |
| *H01Q 1/22* | (2006.01) |
| *H03K 5/14* | (2014.01) |
| *G01S 7/03* | (2006.01) |
| *G01S 7/40* | (2006.01) |
| *G01S 7/35* | (2006.01) |
| *G01S 13/931* | (2020.01) |
| *G01S 13/87* | (2006.01) |
| *G01S 13/93* | (2020.01) |

(52) U.S. Cl.
CPC ............. *H03K 3/01* (2013.01); *G01S 7/032* (2013.01); *G01S 7/038* (2013.01); *G01S 7/35* (2013.01); *G01S 7/4017* (2013.01); *G01S 13/87* (2013.01); *G01S 13/931* (2013.01); *H01Q 1/2283* (2013.01); *H01Q 9/0407* (2013.01); *H03K 5/14* (2013.01); *G01S 7/034* (2013.01); *G01S 2013/9389* (2013.01)

(58) Field of Classification Search
CPC .................................................. H03K 3/01
USPC .................................................. 331/74
See application file for complete search history.

(56) References Cited

U.S. PATENT DOCUMENTS

| | | | |
|---|---|---|---|
| 2014/0232586 A1 | 8/2014 | Ygnace et al. | |
| 2015/0153445 A1* | 6/2015 | Jansen | G01S 7/032 701/93 |
| 2016/0018511 A1 | 1/2016 | Nayyar et al. | |
| 2016/0187464 A1* | 6/2016 | Ginsburg | G01S 7/4008 342/168 |
| 2016/2045898 | 8/2016 | Li et al. | |

FOREIGN PATENT DOCUMENTS

| | | |
|---|---|---|
| DE | 102016101318 A1 | 8/2016 |
| WO | 2016/054291 A1 | 4/2016 |

* cited by examiner

*Primary Examiner* — Joseph Chang
(74) *Attorney, Agent, or Firm* — Rajeev Madnawat

(57) ABSTRACT

An apparatus is provided comprising a first integrated circuit. The first integrated circuit comprises a first element comprising one of a transmit or receive element, an oscillator for providing a first local oscillator signal, a local oscillator output configured to output the first local oscillator signal when activated, a local oscillator input configured to receive a master local oscillator signal when activated; and first switching circuitry for selectively coupling the first element to one of the oscillator and the local oscillator input.

16 Claims, 6 Drawing Sheets

CASCADED TRANSCEIVER INTEGRATED CIRCUIT

CROSS-REFERENCE TO RELATED APPLICATIONS

This application claims the priority under 35 U.S.C. § 119 of European Patent application no. 16205828.3, filed on Dec. 21, 2016, the contents of which are incorporated by reference herein.

FIELD

The present application relates to radar transceivers and in particular but not exclusively to the implementation of multiple integrated circuits in a radar system.

BACKGROUND

In radar systems, a radar front end integrated circuit may be provided. This front end integrated circuit (IC) may comprise a plurality of receive and/or transmit elements and be configured to receive or transmit radio frequency (RF) radar signals. The operation of the receive and/or transmit elements may be synchronised in order to provide a phase coherent system. In order to facilitate this, a common oscillator signal may be shared between the elements.

SUMMARY

According to a first aspect of the present application, there is provided an apparatus comprising a first integrated circuit comprising: a first element comprising one of a transmit or receive element; a oscillator for providing a first local oscillator signal; a local oscillator output configured to output the first local oscillator signal when activated; a local oscillator input configured to receive a master local oscillator signal when activated; and first switching circuitry for selectively coupling the first element to one of the oscillator and the local oscillator input.

The first integrated circuit may be a master integrated circuit and the local oscillator is activated to output the first local oscillator signal as the master local oscillator signal. The local oscillator input may be activated to receive the master local oscillator signal. The first switching circuitry may be configured to couple the first element to the local oscillator input. The first integrated circuit may further comprise a second element comprising one of a transmit and receive element and second switching circuitry for selectively coupling the second element to one of the local oscillator input and the oscillator. The second switching circuitry may be configured to couple the second element to the oscillator.

The apparatus may further comprising a delay line with the local oscillator output and local oscillator input, the delay line being external to the first integrated circuit. The electrical delay length of the delay line may correspond to a distance of the first element to a first unwanted reflected received by the first element. The first switching circuitry may be configured to couple the first element to the oscillator. The element may be an antenna for a radar system.

According to a second aspect, there is provided a system comprising: a first integrated circuit comprising: a first element comprising one of a transmit or receive element; a oscillator for providing a first local oscillator signal; a local oscillator output configured to output the first local oscillator signal when activated; a local oscillator input configured to receive a master local oscillator signal when activated; and first switching circuitry for selectively coupling the first element to one of the oscillator and the local oscillator input; and at least one further integrated circuit comprising: at least one first element comprising one of a transmit or receive chain; a voltage controlled oscillator for providing a further local oscillator signal; a local oscillator output configured to be deactivated; a local oscillator input configured to be activated to receive the master local oscillator signal; and a switch for selectively coupling the at least one first element to the local oscillator input.

The system may be a radar system. The element may be an antenna element. The element may be one of a planar patch antenna and/or 3D integrated antenna. The oscillator may be a voltage controlled oscillator.

FIGURES

Embodiments will be described, by way of example only, with reference to the drawings, in which.

It will be appreciated that for features that span more than one drawing like reference numerals indicate the like feature.

DETAILED DESCRIPTION

Figure 1:
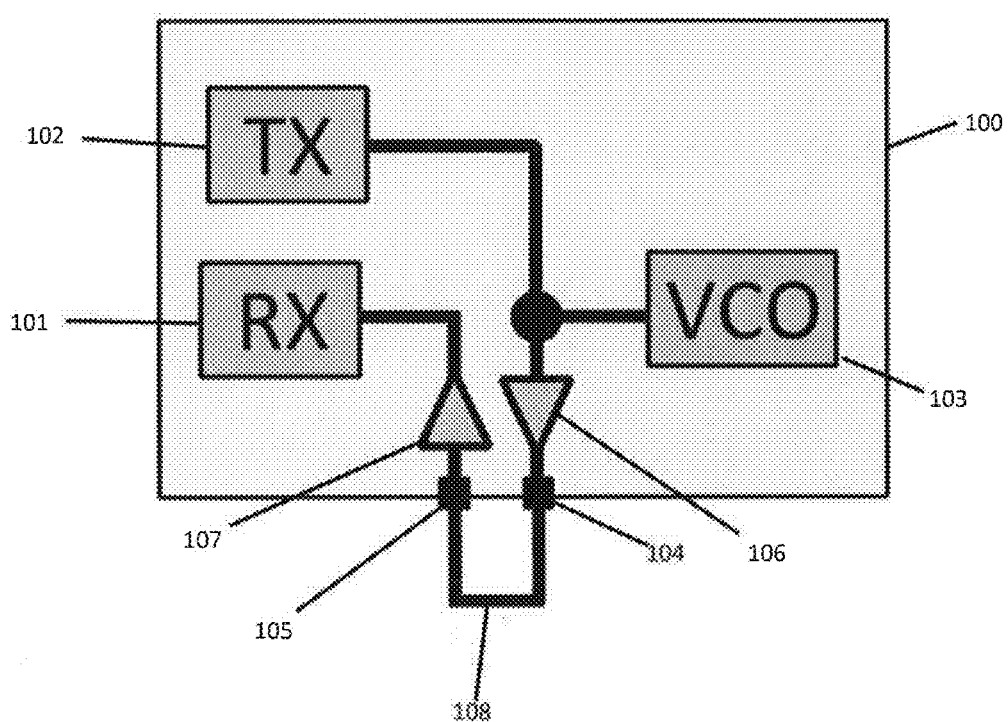
FIG. 1 is a schematic diagram of a first example implementation of an embodiment.

Radar transceivers implemented on an integrated circuit may typically be implemented for a specific application and may not be difficult to adapt to be used for various other applications. Embodiments of the present application present a radar system in which a plurality of integrated circuits, each comprising receive and/or transmit circuitry, may be cascaded to form an adaptable system. A local oscillator signal may be generated and cascaded through the plurality of integrated circuit in a manner that is phase consistent.

In embodiments an integrated circuit is provided comprising an element, for example a receive element and/or a transmit element and a signal generator, for example an oscillator. The oscillator may be capable of providing a first local oscillator signal when activated. The integrated circuit may further have a local oscillator output port which, when activated, will provide the first local oscillator signal to circuitry external to the integrated circuit (off-chip). The local oscillator output port may be activated by coupling it to the output of the oscillator. The integrated circuit may also comprise a local oscillator input port which, when activated, will receive a master local oscillator signal from circuitry external to the integrated circuit (off-chip). The first element can be selectively coupled to receive an oscillator signal from the oscillator or the local oscillator input port. If further elements are on the integrated circuit, they may also be selectively coupled to receive an oscillator signal directly from the oscillator or from the local oscillator input port.

The integrated circuit may be adjustable in that it may generate a master local oscillator signal for the radar system by activating the local oscillator output port. In this case, the integrated circuit will be a master integrated circuit. Elements, for example, transmit and/or receive elements, on the master integrated circuit may receive an oscillator signal directly from the oscillator or via the local oscillator input port which may be coupled to the local oscillator output port to receive the master local oscillator signal. Connecting the local oscillator input port to the local oscillator output port means that, if required, delay elements may be introduced into the connection as it is external to the integrated circuit. This may be useful in some modes of operation.

The radar system may comprise a plurality of integrated circuits. A master integrated circuit will provide a master local oscillator signal to one or more slave integrated circuits. The master local oscillator signal may be provided to local oscillator input ports of the slave integrated circuits and provided to elements on the slave integrated circuit.

Delay elements may be introduced in a path between a master local oscillator output port and the local oscillator input ports in various embodiments. The integrated circuits may be cascaded while having a master local oscillator signal generated by an oscillator of a master integrated circuit. It will be appreciated that as the local oscillator input ports, local oscillator output ports, elements and oscillators of the system may be selectively connected to each other, a variety of cascaded configurations are possible. Some examples of configurations are discussed in relation to FIGS. 1 to 5.

FIG. 1 shows a first example configuration of an integrated circuit comprising a transmit and a receive element in accordance with an embodiment. The integrated circuit 100 may be cascaded with other integrated circuits to form a radar transceiver system, however in this example, the integrated circuit 100 is implemented individually.

An element may be an antenna for the radar system and for a receive element, may be configured to receive radar signals and for a transmit element, be configured to transmit radar signals. The antennas may be directly coupled to a radar signal input or output. In some examples, the antenna may be for example, planar patch antenna and/or 3D integrated antenna.

The integrated circuit 100 comprises a receive element 101 and a transmit element 102. The integrated circuit further comprises an oscillator. The oscillator may comprise a voltage controlled oscillator.

The integrated circuit 100 comprises a local oscillator output port 104 and a local oscillator input port 105. The local oscillator output port 104 may be configured to be coupled to an output of the oscillator 103 when the local oscillator output port 104 is activated. In this case, the local oscillator output port 104 is activated and is coupled to the oscillator 103 via a buffer 106 on the integrated circuit 100.

The buffer 106 may provide gain and output power to allow sufficient drive level to an external component (in this example, the delay line 108), the buffer 107 may act as input amplifier to provide gain and power to the internal circuit (in this case, the receive element 101). It will be appreciated that the implementation of such buffers is optional and they may be absent in some implementations. The elements 102 and 101 may be selectively coupled to either the oscillator 103 or to the local oscillator input port 105. In this example, the transmit element 102 is coupled directly to the oscillator 103 with a connection on the integrated circuit 100. The receive element 101 is coupled to the local oscillator input port 105 via a buffer 107 on the integrated circuit 107.

The local oscillator output port 104 is coupled to the local oscillator input port 105 and provides a local oscillator signal from the oscillator 103 to the local oscillator input port 105. In this case, the oscillator is coupled to provide a local oscillator signal externally to the integrated circuit 100 and the integrated circuit 100 is a master integrated circuit providing a master local oscillator signal from the master oscillator. The local oscillator input port 105 received the master local oscillator signal and provides it to the receive element 101.

The connection between the local oscillator output port 104 and local oscillator input port 105 is external to the integrated circuit 100 and an external delay element 108 may be introduced between the two. This may be implemented in, for example, a systems where a radar sensor is mounted behind a bumper. In this case strong reflections from the bumper will degrade the sensor sensitivity and will affect the detection of close objects (for example in parking applications). Splitting the connection of the local oscillator signal between the transmit and receive elements, allows and an external delay line to be introduced to the receive element 101. This delay may be configured to mitigate the strong bumper reflection which may enable a higher signal to noise ratio (SNR) for close objects. In some examples, the delay line 108 may be of few millimetres such that the length of the electrical delay may correspond to a distance between the antenna to a major unwanted reflection—in this example, the bumper.

Figure 2:
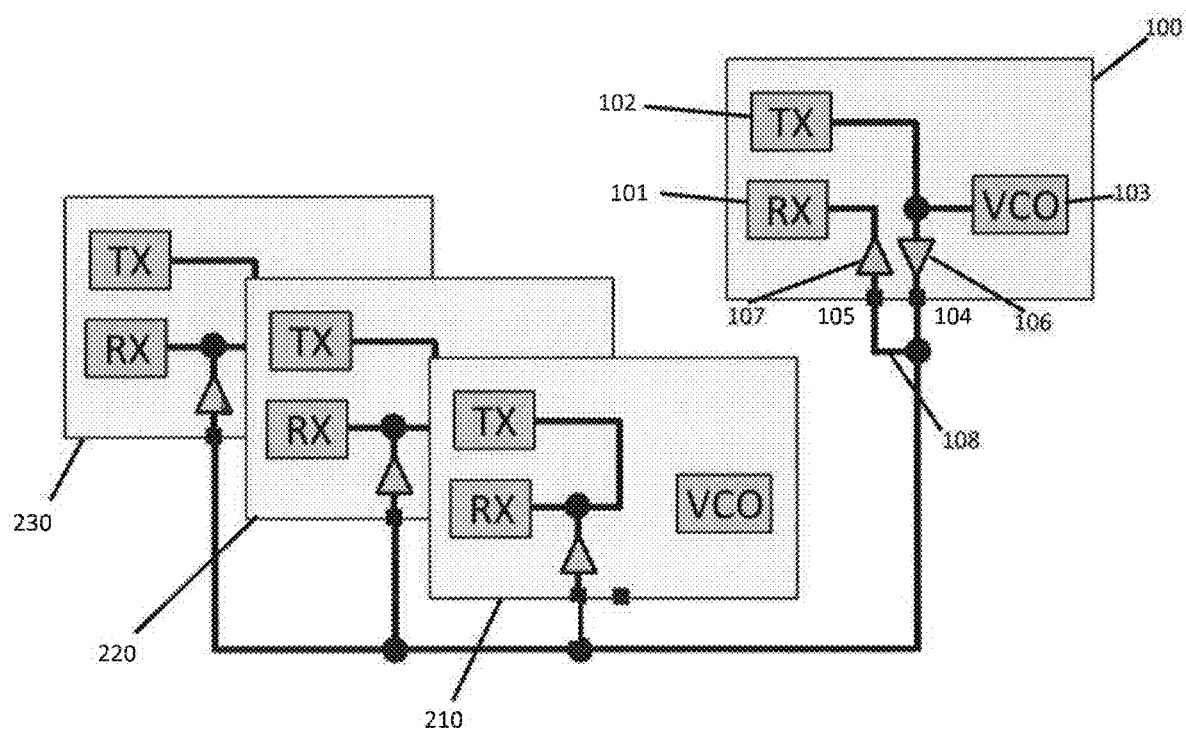
FIG. 2 is a schematic diagram of a second example implementation of an embodiment.

While FIG. 1 shows an implementation of the invention on a single integrated circuit, it will be appreciated that in other examples, a plurality of integrated circuits may be cascaded with one of the integrated circuits acting as a master integrated circuit. FIG. 2 gives one such example.

In the example of FIG. 2, a master integrated circuit 100 is configured similarly to the integrated circuit as described in relation to FIG. 1. In this regard it will be appreciated that like reference numerals depict like features.

The radar system 200 of FIG. 2 comprises a master integrated circuit 100 and a first slave integrated circuit 210, second slave integrated circuit 220 and third slave integrated circuit 230. Each of the slave circuits comprise a frequency generating element (for example oscillator 103), transmit element and receive element. Each of the slave integrated circuits further comprise a local oscillator output port and local oscillator input port. In the example of FIG. 2, the master integrated circuit 100 provides a master local oscillator signal at the master local oscillator output port 104.

The master oscillator signal may be provided to the local oscillator input ports of each of the slave integrated circuits. The slave integrated circuit may be configured to couple their local oscillator input ports to provide the master local oscillator signal to their receive and transmit elements. The local oscillator output ports of the respective slave integrated circuits may be deactivated. In some examples, the oscillators of each of the slave integrated circuits are also deactivated. In other examples, the oscillators may be used for other functions on the integrated circuit and are only deactivated with respect to the transmit and receive elements.

In this example, the master integrated circuit and slave integrated circuit may be phase coherent. The master oscillator signal received at each respective input of the plurality of elements across the integrated circuits may be phase coherent. This may be due to the local oscillator input port 105 of the master integrated circuit 100 receiving the master oscillator signal that has been routed from the local oscillator output port 104 of the master integrated circuit. This routing external to the integrated circuit may introduce a delay that is equal to the delay caused by the routing of the master local oscillator signal to the slave integrated circuits.

The elements may all received a phase coherent local oscillator signal. In this example, the delay line 108 at the master integrated circuit may be set to be equal to the delay incurred by the connection between the master local oscillator output port 104 and the local oscillator input ports of the slave integrated circuits 210, 220 and 230.

Figure 3:
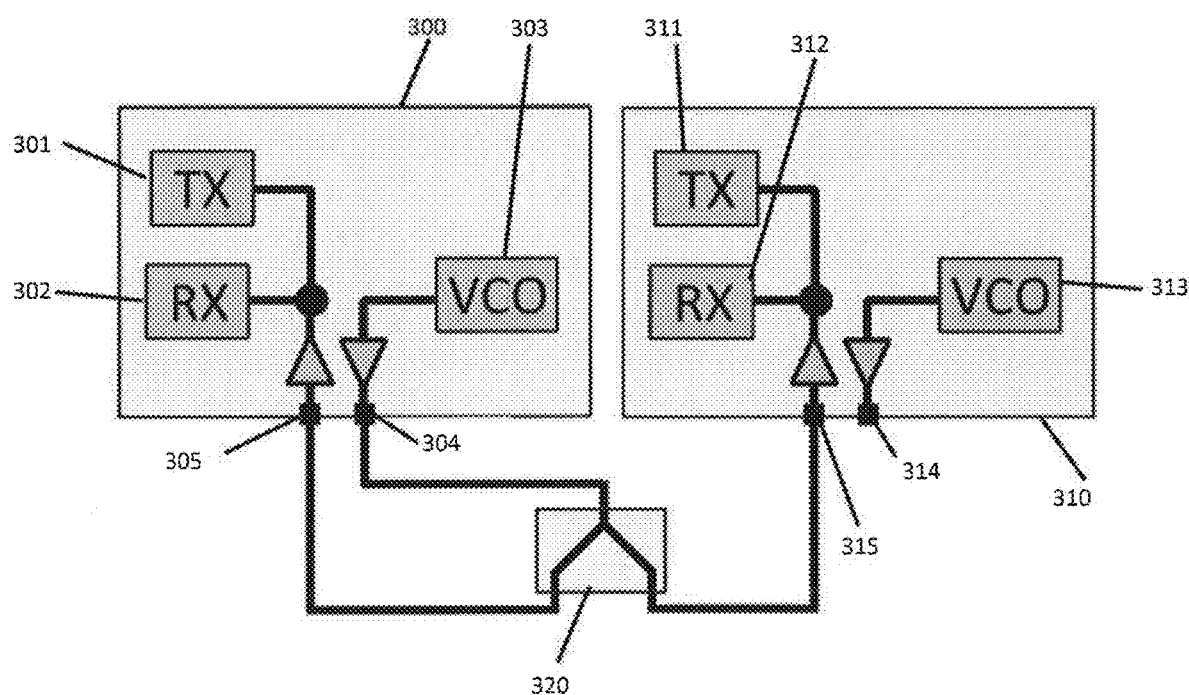
FIG. 3 is a schematic diagram of a third example implementation of an embodiment.

FIG. 3 shows another example configuration of cascaded integrated circuits in a radar system. FIG. 3 shows a master integrated circuit 300 and a slave integrated circuit 310. The master integrated circuit 300 comprises a transmit element 301, a receive element 302, a oscillator 303, a local oscillator output port 304 and a local oscillator input port 305. The slave integrated circuit 310 comprises a transmit element 311, a receive element 312, a oscillator 313, a local oscillator output port 314 and a local oscillator input port 315.

In this example, the local oscillator output port 304 of the master integrated circuit is activated to provide a master local oscillator signal externally to the master integrated circuit 300. The local oscillator port 304 of the master integrated circuit 300 is coupled to the oscillator 303. The transmit and receive elements 301 and 302 of the master integrated circuit are coupled to the local oscillator input port 305 which is activated to provide the master local oscillator signal.

On the slave integrated circuit 310, the oscillator 313 and the local oscillator output port 314 may be deactivated. The transmit and receive elements 311 and 312 of the slave integrated circuit 310 may be coupled to the local oscillator input port 315 which is activated to provide the master local oscillator signal to the transmit and receive elements 311 and 312.

The master oscillator signal may be routed from the local oscillator output port 304 externally to the integrated circuits and split at splitter 320. The respective split master oscillator signals may then be routed back to the respective local oscillator input ports 305 and 315.

In this examples, the integrated circuit 300 is acting as a master and providing the master local oscillator signal the master local oscillator output port 304 to the slave integrated circuit 310. By feeding the master oscillator signal to one or more slave integrated circuits in the system via their respective local oscillator input ports, an internal integrated circuit delay (from the local oscillator input port to an input of an transmit or receive element on the integrated circuit) is identical. This may provide phase coherence over temperature variations.

It will be appreciated that the length of the external coupling from the power splitter 320 to the respective local oscillator input ports 315 and 305 should be identical to achieve identical phase distribution.

While the oscillator 313 of the slave integrated circuit 310 is deactivated in this example, in other example it may be tuned for use in other functions.

Figure 4:
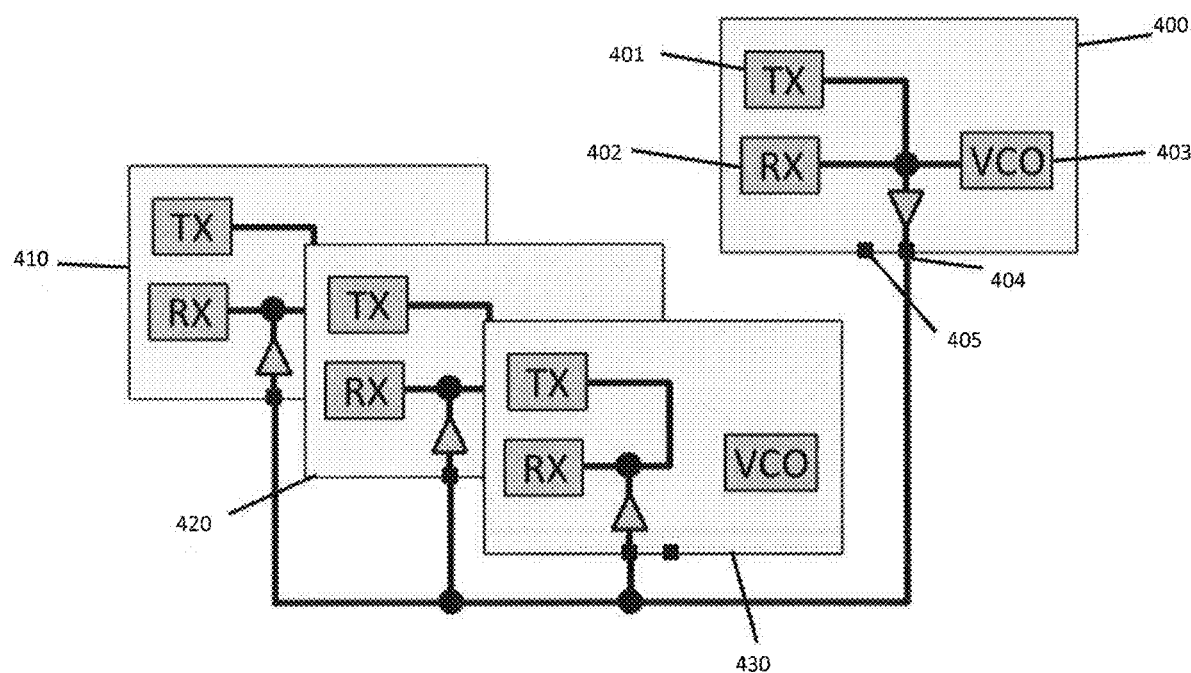
FIG. 4 is a schematic diagram of a fourth example implementation of an embodiment.

FIG. 4 shows another example configuration of cascaded integrated circuits in a system.

FIG. 4 comprises a master integrated circuit 400 and a first 410, second 420 and third 430 slave integrated circuit.

The master integrated circuit 400 comprises a transmit element 401, a receive element 402, a oscillator 403, a local oscillator output port 404 and a local oscillator input port 405. The slave integrated circuits 410, 420, 430, each comprises a transmit element, a receive element, a oscillator, a local oscillator output port and a local oscillator input port.

In this example, the local oscillator output port 404 of the master integrated circuit is activated to provide a master local oscillator signal externally to the master integrated circuit 400. The local oscillator port 404 of the master integrated circuit 400 is coupled to the oscillator 403. The transmit and receive elements 401 and 402 of the master integrated circuit are coupled to the oscillator output.

For each slave integrated circuit 410, 420, 430 the oscillator and the local oscillator output port may be deactivated. The transmit and receive elements of the respective slave integrated circuits may be coupled to the local oscillator input ports which are activated to provide the master local oscillator signal to the transmit and receive elements.

The master oscillator signal may be routed from the local oscillator output port 404 externally to the integrated circuits provided to a respective local oscillator input port of each of the slave integrated circuits 410, 420 and 430.

In this example, the master and slave integrated circuits are not phase coherent over temperature with respect to the master local oscillator signal. This may be because the transmit and receive elements 401 and 402 of the master integrated circuit 400 are coupled to receive the master local oscillator signal directly from the oscillator instead of the master local oscillator input port 405. In this examples, the master integrated circuit may be used for example for elevation measurements. The slave integrated circuits 410, 420 and 430 in this example are phase coherent with respect to the master local oscillator signal.

Figure 5:
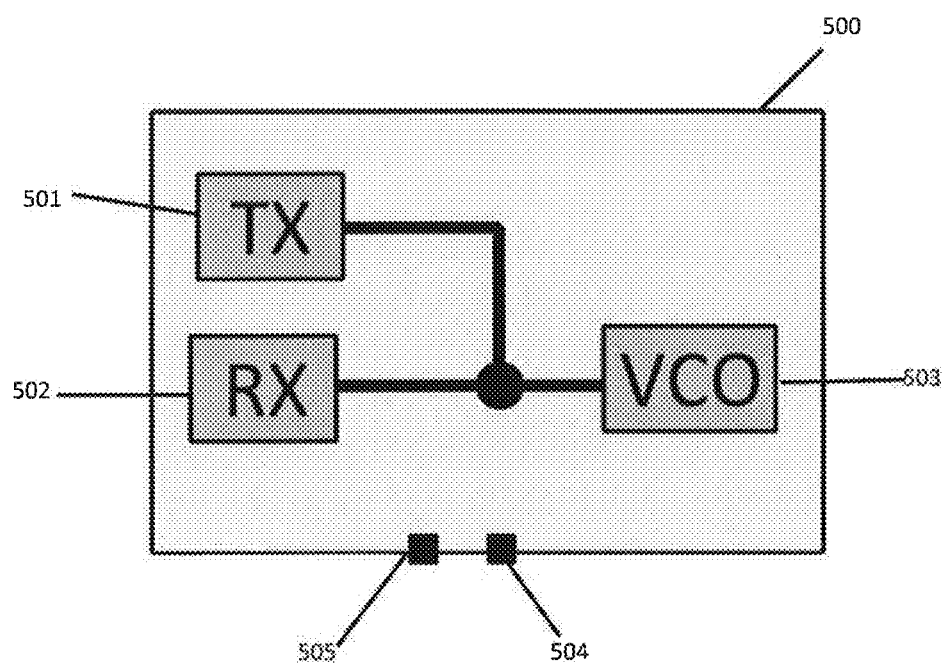
FIG. 5 is a schematic diagram of a fifth example implementation of an embodiment.

FIG. 5 shows another example of a potential configuration of an integrated circuit. In the example of FIG. 5, an integrated circuit is not used for cascaded and the elements of the integrated circuit receive a local oscillator signal from the oscillator on the integrated circuit.

The master integrated circuit 500 comprises a transmit element 501, a receive element 502, a oscillator 503, a local oscillator output port 504 and a local oscillator input port 505. The local oscillator output port 504 and the local oscillator input port 505 are deactivated and the transmit element 501 and the receive element 502 receive a local oscillator signal directly from the oscillator 503.

Figure 6:
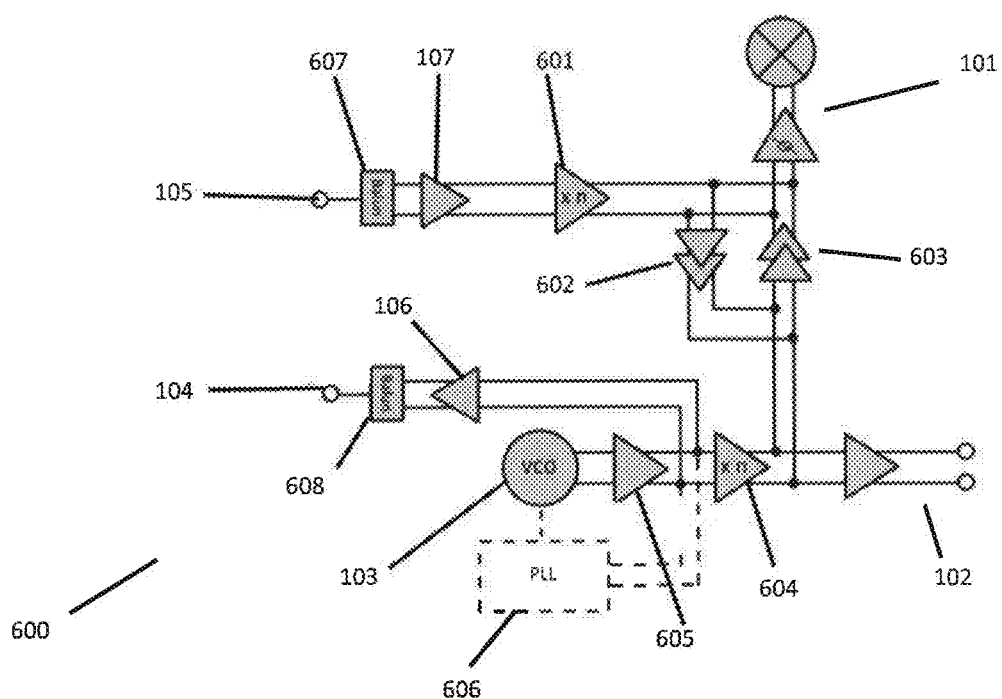
FIG. 6 is a schematic diagram of an example implementation of on-chip circuitry.

FIG. 6 shows an example of switching circuitry that may be implemented on an integrated circuit 100, 400, 500 in order to enable the selective connection of an element to a local oscillator input port or oscillator and an activation of a local oscillator output port and/or local oscillator input port.

It will be appreciates that some of the circuitry of FIG. 6 may correspond to circuitry already described and like reference numerals depict like features.

The integrated circuit 600 of FIG. 6 comprises a local oscillator output port 104, local oscillator input port 105, oscillator 103, receive element 101 and transmit element 102. The oscillator 103 may be coupled to the local oscillator output port 104 via a first select buffer 605, optional amplifying buffer 106 and optional balun 608. When the local oscillator output port is activated, the select buffer 605 may be configured to couple the oscillator to the local oscillator output port.

The oscillator 103 is selectively coupled to the transmit element 102 via the first select buffer 605 and a second select buffer 604. The first and second select buffers are configured to couple the oscillator 103 to the transmit element 102 when the transmit element 102 is to receive an oscillator signal directly from the oscillator 103.

The oscillator 103 is further selectively coupled to the receive element 101 via the first select buffer 605, the second select buffer 604 and third select buffer 603. The first 605, second 604 and third select 603 buffers are configured to couple the oscillator signal to the receive element 101 when selected.

The receive element 101 and transmit element 102 are further configured to be coupled to a local oscillator input port 105. The local oscillator input port 105 may be coupled to a fourth select buffer 601 via an optional balun 607 and optional amplifying buffer 107. The fourth select buffer 601 may be selectively coupled to the receive element 101. The fourth select buffer 601 may be selectively coupled to the transmit element 102 via a fifth select buffer 602.

In operation, the first to fifth select buffers may be selectively controlled to couple the oscillator 103, receive element 101 and transmit element 102 to the local oscillator input and output ports 104, 105 and to the oscillator signal provided by oscillator 103.

While the switching of the integrated circuit has been exemplified with the use of the first to fifth buffers, it will be appreciated that other switching circuitry may be implemented.

In the foregoing, an integrated circuit has been depicted as comprising a local oscillator and receive and transmit elements, it will be appreciated that an integrated circuit may comprise a differing configuration of elements in other embodiments. In some examples, an integrated circuit may comprise only receive elements or only transmit elements. It will be appreciated that the present application may be application to integrated circuit having any combination of receive and transmit elements.

In the foregoing reference has been made to an oscillator. It will be appreciated that the oscillator may be provided by a suitable oscillator circuitry, for example a voltage controlled oscillator or other signal generator.

In the foregoing, a split coupling from a local oscillator output port to two or more local oscillator input ports has been depicted. It will be appreciated that the split coupling may be implemented by any suitable connection. In some examples, the split coupling may be realized by passive structures such as a Wilkinson divider or rat-race coupler.

The invention claimed is:

1. An apparatus comprising a first integrated circuit comprising:
   a transmit element;
   a receive element;
   an oscillator configured to provide a first local oscillator signal;
   a local oscillator output configured to output the first local oscillator signal when activated;
   a local oscillator input configured to receive a master local oscillator signal when activated;
   a first plurality of select buffers configured to selectively couple the transmit element and the receive element to the oscillator; and
   a second plurality of select buffers configured to selectively couple the local oscillator input to the oscillator, the receive element, and the transmit element.

2. The apparatus of claim 1, wherein the first integrated circuit is a master integrated circuit and the local oscillator is configured to output the first local oscillator signal as the master local oscillator signal.

3. The apparatus of claim 2, wherein the local oscillator input is activated to receive the master local oscillator signal.

4. The apparatus of claim 1, further comprising:
   a delay line external to the first integrated circuit connected between the local oscillator output and the local oscillator input.

5. The apparatus of claim 4, wherein an electrical delay length of the delay line corresponds to a distance of the first element to a first unwanted reflection received by the first element.

6. The apparatus of claim 1, wherein the first element is an antenna for a radar system.

7. The apparatus of claim 1, wherein the first plurality of select buffers comprises a first select buffer and a second select buffer that are configured to selectively couple the oscillator to the transmit element.

8. The apparatus of claim 7, wherein the first plurality of select buffers further comprises a third select buffer that is configured to selectively couple the oscillator to the receive element in combination with the first select buffer and the second select buffer.

9. The apparatus of claim 8, wherein the second plurality of select buffers comprises a fourth select buffer that is configured to be selectively coupled to the receive element.

10. The apparatus of claim 9, wherein the second plurality of select buffers further comprises a fifth select buffer that is configured to selectively couple the fourth select element to the transmit element.

11. The apparatus of claim 1, wherein the transmit element is coupled directly to the oscillator.

12. The apparatus of claim 1, wherein the second external port is coupled to the receive element via a buffer that is configured to act as an input amplifier.

13. A system comprising:
   a first integrated circuit comprising:
      a first transmit element;
      a first receive element;
      a first voltage controlled oscillator configured to provide a first local oscillator signal;
      a first local oscillator output configured to output the first local oscillator signal when activated;
      a first local oscillator input configured to receive a master local oscillator signal when activated; and
      a first plurality of select buffers configured to selectively couple the first transmit element and the first receive element to the first voltage controlled oscillator; and
      a second plurality of select buffers configured to selectively couple the first local oscillator input to the voltage controlled oscillator, the first receive element, and the first transmit element; and
   a second integrated circuit comprising:
      a second transmit element;
      a second receive element;
      a second voltage controlled oscillator configured to provide a second local oscillator signal;
      a second local oscillator output configured to be deactivated;
      a second local oscillator input configured to be activated to receive the master local oscillator signal;
      a third plurality of select buffers configured to selectively couple the second transmit element and the second receive element to the second voltage controlled oscillator; and
      a fourth plurality of select buffers configured to selectively couple the second local oscillator input to the voltage controlled oscillator, the second receive element, and the second transmit element.

14. The system of claim 13, wherein the system is a radar system.

15. The system of claim 13, wherein the element is an antenna element.

16. The system of claim 15, wherein the first element is one of a planar patch antenna and/or 3D integrated antenna.

* * * * *